United States Patent [19]

Anazawa

[11] 3,828,229

[45] Aug. 6, 1974

[54] LEADLESS SEMICONDUCTOR DEVICE FOR HIGH POWER USE

[75] Inventor: Shinzo Anazawa, Shoichi, Tokyo, Japan

[73] Assignee: Nippon Electric Company Limited, Tokyo, Japan

[22] Filed: June 4, 1973

[21] Appl. No.: 366,275

Related U.S. Application Data

[63] Continuation of Ser. No. 259,206, June 2, 1972, abandoned.

[30] Foreign Application Priority Data

June 10, 1971 Japan .............................. 46-41582

[52] U.S. Cl....... 317/234 R, 317/234 A, 317/234 G, 317/234 H, 333/84 M

[51] Int. Cl............................. H01l 3/00, H01l 5/00

[58] Field of Search................ 317/234, 1, 3, 3.1, 4, 317/4.1; 333/84 M

[56] References Cited

UNITED STATES PATENTS

| | | | |
|---|---|---|---|
| 3,001,110 | 9/1961 | Frazier | 317/234 G |
| 3,271,507 | 9/1966 | Elliott | 317/234 G |
| 3,735,485 | 5/1973 | Wilson | 317/234 A |

*Primary Examiner*—Andrew J. James
*Attorney, Agent, or Firm*—Sandoe, Hopgood & Calimafde

[57] ABSTRACT

A leadless semiconductor device includes an electrically conductive substrate to which a semiconductor element is fixed. The substrate is insulated from a pair of conductive wall members by means of insulating material arranged intermediate the ends of the substrate and the wall members. The semiconductor element electrodes are electrically connected to the wall members.

4 Claims, 7 Drawing Figures

LEADLESS SEMICONDUCTOR DEVICE FOR HIGH POWER USE

This is a continuation of application Ser. No. 259,206, filed June 2, 1972, now abandoned.

The present invention relates generally to leadless semi-conductor devices and more particularly, to a small-sized leadless semiconductor device that is well suited for high power use.

In the conventional leadless semiconductor devices a metallized layer formed on a ceramic substrate is employed to make the electrical connection to the device. However, this requires the semiconductor element to be fixed to a circuit board with its surface facing with the circuit board, thus impairing the dissipation of heat from the element. Also, the metallized layer tends to deteriorate at the edge portions which results in an increase in the electrical resistance and other undesirable effects in the metallized layer.

It is therefore an object of the present invention to provide an improved leadless semiconductor device in which the semiconductor element can be mounted directly on the substrate.

It is a further object of the invention to provide a leadless semiconductor device in which improved heat dissipation is achieved.

It is another object of the invention to provide a semiconductor device of the type described which need not be face-bonded to a printed circuit.

In accordance with the invention, a semiconductor element is fixed to an electrically and thermally conductive substrate. The latter is electrically insulated from a pair of conducting wall members to which electrodes of the semiconductor element are connected.

The invention will be described in conjunction with the accompanying drawings, in which:

FIGS. 1(A) and 1(B) are respectively a vertical cross-section and a perspective diagram showing the structure of a conventional leadless type semiconductor device;

Figure 4A:
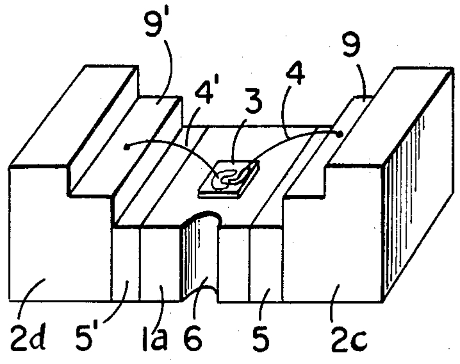
Figure 4B:
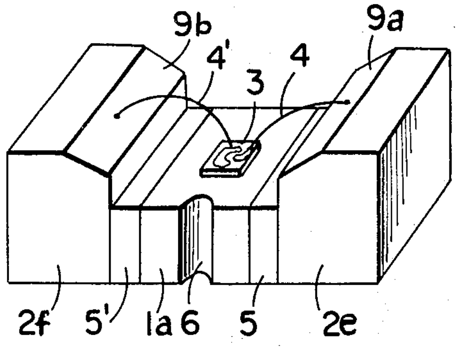
Figure 5:
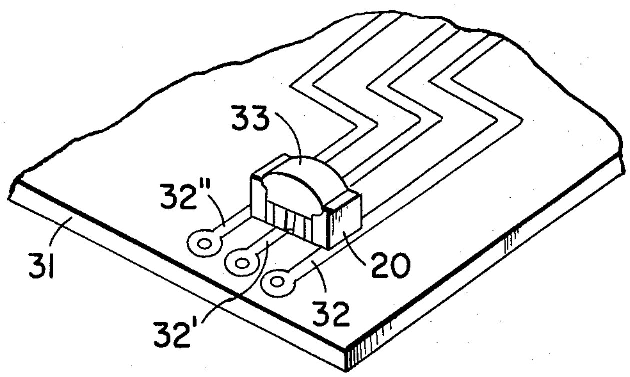

FIGS. 4(A) and 4(B) are perspective views of other examples of leadless semiconductor devices embodying this invention; and FIG. 5 is a perspective diagram on a reduced scale showing how the semiconductor device of this invention may be attached to a printed circuit board.

Figure 1A:
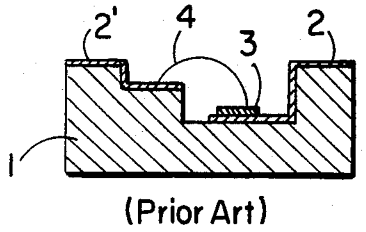
(Prior Art) FIG. 1A
Figure 1B:
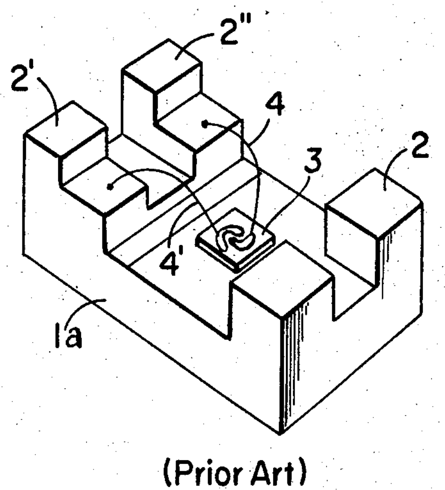
(Prior Art) FIG. 1B

A conventional leadless semiconductor device shown in FIGS. 1(A) and 1(B) includes metallized layers 2, 2' and 2'' disposed and electrically isolated from each other on one surface of a ceramic substrate 1. A semiconductor element 3 is mounted on metallized layer 2, and has electrodes on its upper surface that are electrically connected by thin metal wires 4 and 4' to the metallized layers 2' and 2'' respectively. This conventional structure has the following disadvantages:

1. The substrate 1 must be mounted on a circuit board in the facedown fashion which hampers the effective heat radiation from the device. This problem is particularly serious in the case of semiconductor devices used in high power applications; and 2. The electrical properties of the edge portions of metallized layers 2, 2' and 2'' that are disposed on the ceramic substrate tend to deteriorate, because those portions are vulnerable to the surrounding atmosphere in the actual use and operating conditions of the device.

Figure 2:
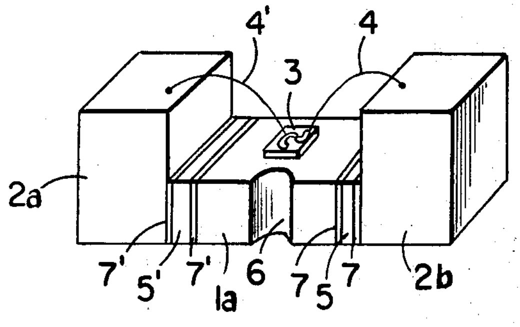
FIG. 2 is a perspective diagram showing the structure of a leadless semiconductor device according to one embodiment of this invention.

To overcome the disadvantages of the prior art structure the semiconductor device of the present invention has a structure such as that shown in FIG. 2. The embodiment therein shown, which is in the form of a header, comprises a substrate 1*a* composed of a material whose thermal conductivity and electrical conductivity are high, conducting wall members 2*a* and 2*b*, and insulating members 5 and 5' constituted of an insulative material and secured to substrate 1*a* and walls 2*a* and 2*b* by means of soldering materials 7' and 7 respectively, as described in greater detail below with reference to FIG. 3. A semiconductor element 3 is mounted on substrate 1*a* of the header, and thin metal wires 4 and 4' respectively, electrically connect the other electrodes on the surface of the semiconductor element to wall members 2*a* and 2*b*. As shown in FIG. 2, wall members 2*a* and 2*b*, substrate 1*a*, and insulating members 5 and 5' are disposed substantially parallel to one another.

The advantages of the leadless semiconductor device of this invention as shown in FIG. 2 in comparison with the conventional one as shown in FIG. 1 are:

1. The substrate 1*a* can be fitted directly onto the circuit board; this is not possible with the prior art, in which the substrate 1 must be reversely installed on the circuit board. The heat generated in the substrate 1*a* is thus easily dissipated to the circuit board.
2. The semiconductor device of this invention is free from the problems of the prior art, such as breaks in the metallized layer formed on the ceramic substrate, the peeling of the metallized layer from the substrate due to the aging, and the subsequent increase in the resistance of the metallized layer. Furthermore, in the present invention, the area of the electrode is large enough to offer a relatively low resistance against large current.

Figure 3:
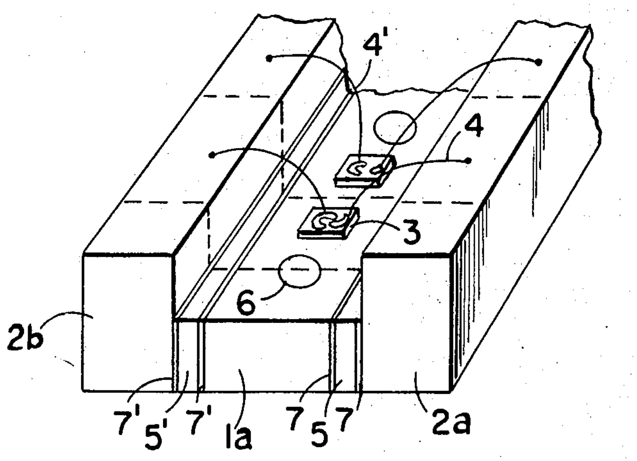
FIG. 3 is a perspective diagram illustrating the method of producing the leadless semiconductor device of FIG. 2.

FIG. 3 schematically shows a structure that may be advantageously employed to fabricate the embodiment of this invention shown in FIG. 2. A conductive substrate 1*a* which may be made of copper, having holes 6, wall members 2*a* and 2*b* made of copper plate, insulating members 5 and 5', and an aluminum oxide ceramic plate whose surfaces have molybdenum manganese metallized and nickel-plated, are soldered together by suitable soldering materials 7 and 7', which may be an eutectic mixture solder of silver and copper, at a temperature of 850°C in a hydrogen atmosphere. In this manner a header is provided in the form of a linkage body. If necessary, a plurality of linkage bodies may be formed in the two-dimensional direction.

If necessary, gold may be selectively plated on the header linkage body. Semiconductor elements 3, 3', . . . are mounted on the header. Then, the electrodes of the semiconductor elements 3, 3', . . . are electrically connected to the wall members 2*a* and 2*b* through thin metal wires 4 and 4', which may be made of gold.

If necessary, portions of the semiconductor elements may be coated with a suitable resin. The resultant structure is then cut across the dotted lines as shown in FIG. 3, to form a plurality of semiconductor devices each having the structure shown in FIG. 2. In this manner, the semiconductor device of this invention can be manufactured on a mass-production basis and semiconductor element-mounting can be easily carried out.

FIGS. 4(*a*) and (*b*) illustrate other embodiments of the present invention in which the thin metal wires are arranged so that they are not exposed on the surface of the completed structure. To this effect cut-out portions 9 and 9' to which the ends of wires 4 and 4' are respectively connected are formed in the wall members 2*c* and 2*d*. Cut-out portions 9 and 9' may be in the form of grooves. In the embodiment of the invention shown in FIG. 4(*b*), the ends of wires 4 and 4' are respectively connected to downwardly sloping portions 9*a* and 9*b* of wall members 2*e* and 2*f*.

FIG. 5 shows one manner in which the leadless semiconductor device of FIG. 4(*a*), designated 20 in the figure, can be mounted on a printed circuit board. As therein shown, metallized patterns 32, 32' and 32'' are formed on a circuit board 31, and the header electrodes of the resin-molded leadless semiconductor device are electrically connected to these metallized patterns such as by the use of solder or the like.

In the embodiments of the invention herein described, a metal is used as the material of the header. Alternatively, graphite or sapphire and other thermoconductive electrically insulative materials may be used for the substrate or wall member, with selected portions of the surface thereof being covered with conductive material or converted to a conductive material through chemical processing. More specifically, the substrate in the structure of FIG. 3 may be made, for example, of a single crystal of graphite or sapphire whose surface is almost entirely coated with molybdenum-manganese or the like through a baking process. Thus, it will be apparent that the invention is not limited to those embodiments thereof actually herein described, and that modifications to those embodiments may be made without necessarily departing from the spirit and scope of the invention.

What is claimed is:

1. A high power leadless semiconductor device comprising a substrate having first and second confronting side surfaces, an upper and a bottom surface, first and second laterally spaced wall members, first and second insulating members, said side surfaces of said substrate being respectively bonded to said first and second wall members with said first and second insulating members being respectively interposed therebetween, a high power semiconductor element bonded to said upper surface of said substrate and including first and second electrodes, means for electrically connecting said first and second electrodes to said first and second wall members respectively, said bottom surface of said substrate and the bottom surfaces of said first and second wall members forming a common flat plane to thereby permit said bottom surfaces of said substrate and said first and second wall members to be in direct contact with an external circuit board, said substrate having a relatively high thermal and electrical conductivity, and said first and second wall members having a relatively high electrical conductivity, whereby high power to be consumed and heat generated in said semiconductor element are respectively supplied to and dissipated from said semiconductor element through said first and second wall members and said substrate.

2. The high power semiconductor device of claim 1, in which said insulating members are soldered at opposing end surfaces thereof to the confronting end surfaces of said substrate and said first and second wall members.

3. In combination with the semiconductor device of claim 1, a printed circuit board including first, second and third insulating conducting area patterns formed thereon and respectively connected electrically to said opposing surfaces of said wall members and said substrate.

4. The high power semiconductor device of claim 1, wherein said upper surface of said substrate is positioned at a lower level than that of said first and second wall members, and said semiconductor element is embedded with resin.

* * * * *